（12）United States Patent
Hu et al.

(10) Patent No.: US 8,770,536 B2
(45) Date of Patent: Jul. 8, 2014

(54) CLIPPING APPARATUS FOR EXPANSION CARD

(75) Inventors: Cong-Xu Hu, Wuhan (CN); Yu-Lan Liu, Wuhan (CN); Yong Ma, Wuhan (CN); Chao-Jie Cai, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/568,202

(22) Filed: Aug. 7, 2012

(65) Prior Publication Data

US 2013/0153729 A1    Jun. 20, 2013

(30) Foreign Application Priority Data

Dec. 20, 2011 (CN) .......................... 2011 1 0429324

(51) Int. Cl.
*A47B 97/04*    (2006.01)

(52) U.S. Cl.
USPC .............................. 248/447; 248/452; 248/454

(58) Field of Classification Search
USPC ......... 248/447, 452, 454, 455, 456, 457, 460, 248/462
See application file for complete search history.

(56) References Cited

U.S. PATENT DOCUMENTS

| | | | | | |
|---|---|---|---|---|---|
| 1,571,131 | A | * | 1/1926 | McIntosh | 248/456 |
| 1,797,889 | A | * | 3/1931 | Wiberg | 248/454 |
| 3,799,488 | A | * | 3/1974 | Sena | 248/452 |
| 4,702,453 | A | * | 10/1987 | Bishop | 248/447.2 |
| 4,753,408 | A | * | 6/1988 | Wailes | 248/371 |
| 5,145,141 | A | * | 9/1992 | Hunter | 248/452 |

* cited by examiner

*Primary Examiner* — Gwendolyn Baxter
(74) *Attorney, Agent, or Firm* — Novak Druce Connolly Bove + Quigg LLP

(57) ABSTRACT

A clipping apparatus includes a base, a support bracket, a positioning member and a rotating arm. The support bracket is located on the base. The support bracket is oblique relative to the base and defines a sliding slot. The positioning member is slidably engaged in the sliding slot. A first end of the rotating arm is pivotably engaged with the base. A second end of the rotating arm, opposite to the first end, is secured to the positioning member. An angle defined between the base and the support bracket is adjustable when the positioning member is slid relative to the base.

15 Claims, 4 Drawing Sheets

CLIPPING APPARATUS FOR EXPANSION CARD

BACKGROUND

1. Technical Field

The present disclosure relates to clipping apparatuses, and particularly to a clipping apparatus for an expansion card.

2. Description of Related Art

Expansion cards, such as graphics cards and audio cards, should be tested a plurality of parameters, such as wiring, before shipment. During testing, the expansion cards are positioned on a support bracket and secured to the support bracket by an installation clip. However, it is inconvenient to adjust testing angles of the expansion cards, which make the testing a complicated process.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
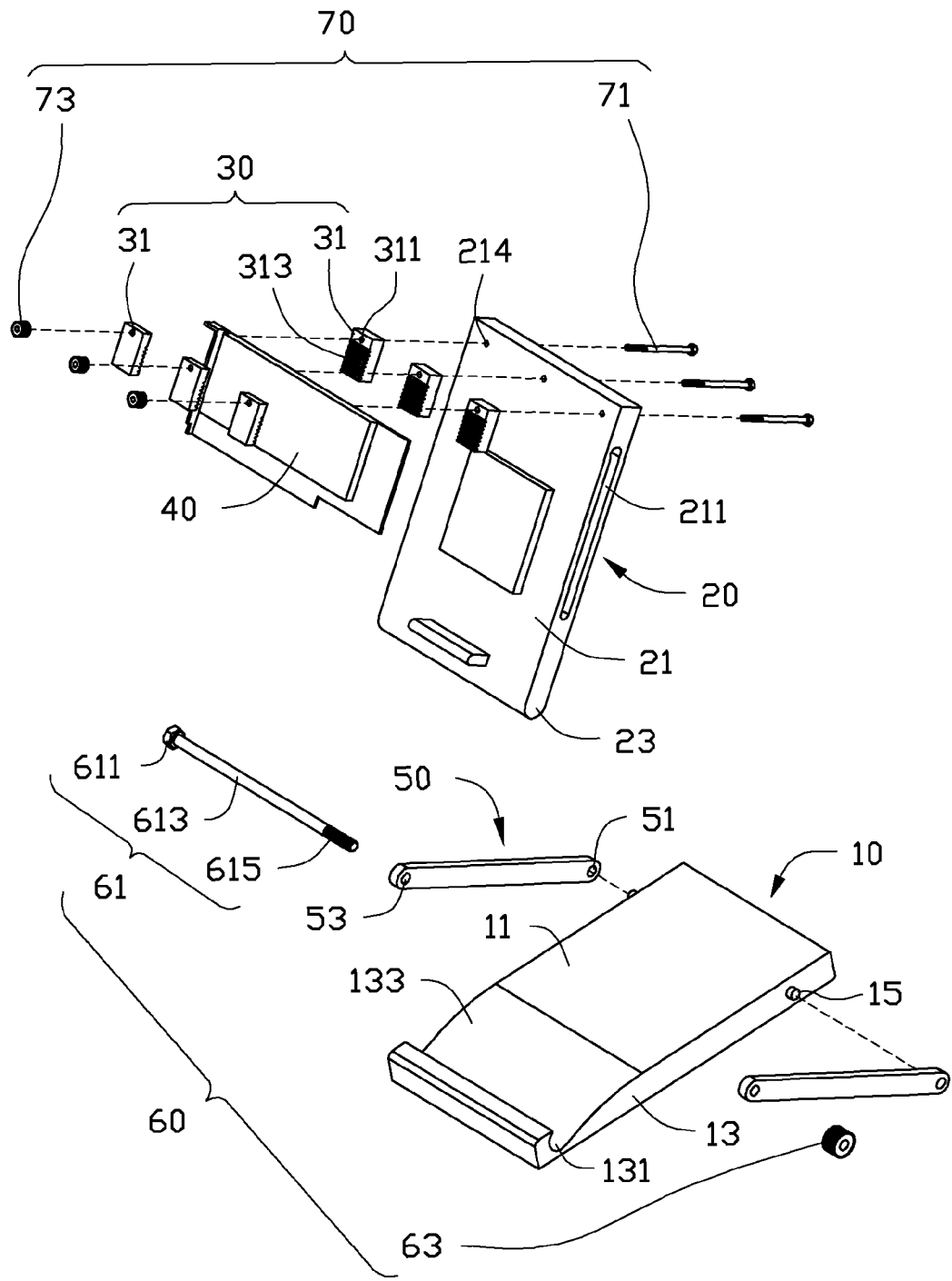
FIG. 1 is an exploded, isometric view of one embodiment of a clipping apparatus and an expansion card.
Figure 2:
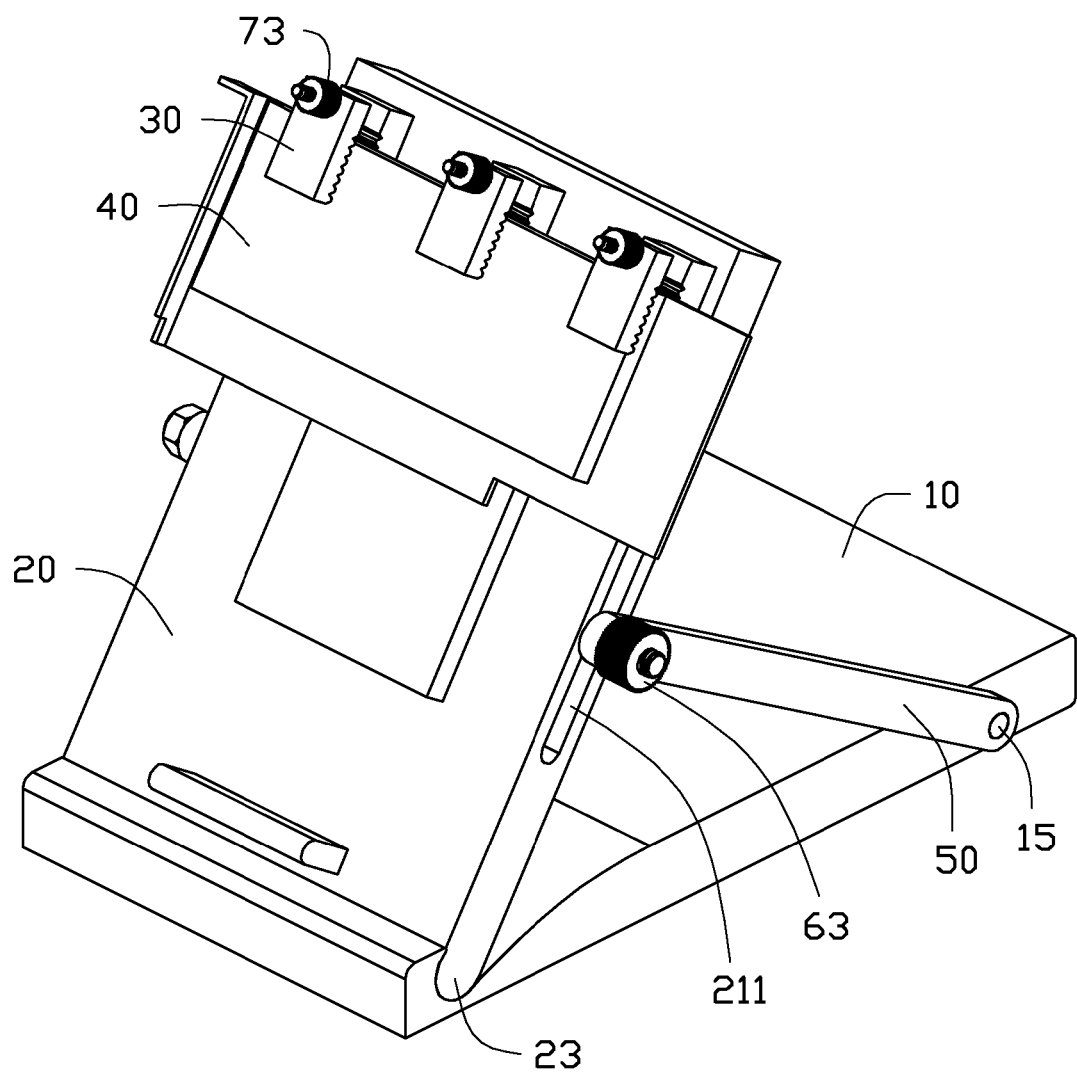
FIG. 2 is an assembled, isometric view of the clipping apparatus and the expansion card of FIG. 1.

FIG. 1 and FIG. 2 show a clipping apparatus for an expansion card 40 in accordance with an embodiment. The clipping apparatus includes a base 10, a support bracket 20, three clips 30, two rotating arms 50, and a positioning member 60. In one embodiment, the expansion card 40 is a graphics card or an audio card.

The base 10 includes a body 11, a receiving portion 13, and two pivoting post 15 protruding from two opposite sides of the body 11. The receiving portion 13 defines a recess slot 131, so as to form a connecting plane 133 on the receiving portion 13. The connecting plane 133 has an arc shape.

The support bracket 20 includes a support plate 21 and a positioning portion 23 extending from a side of the support plate 21. The positioning portion 23 is half-cylindrical. The support plate 21 defines a sliding slot 211. In one embodiment, the support plate 21 is rectangular. The support plate 21 defines three installation holes 214. An extending direction of the sliding slot 211 is substantially parallel to the support plate 21.

Each clip 30 includes two clipping portions 31. Each clipping portion 31 defines a locking hole 311 corresponding to the installation hole 214. Each clip 30 further includes a plurality of clipping grains 313 on each clipping portion 31.

The clipping apparatus further includes three locking members 70. Each locking member 70 is for securing each clip 30 to the support plate 21. Each locking member 70 includes a locking bar 71 and a nut 73. The locking bar 71 has a plurality of outer threads (not labeled). The nut 73 has a plurality of inner threads (not labeled).

A first end of each rotating arm 50 defines a pivoting hole 51 corresponding to the pivoting post 15. A second end of each rotating arm 50 defines a positioning hole 53.

The positioning member 60 includes a positioning pole 61 and a positioning nut 63. The positioning pole 61 includes a head portion 611, a main portion 613, and a locking portion 615. The main portion 613 is located between the head portion 611 and the locking portion 615. The locking portion 615 has a plurality of outer threads. The positioning nut 63 has a plurality of inner threads. The positioning pole 61 can be inserted through the positioning hole 53 and the sliding slot 211 and engaged with the positioning nut 63.

FIG. 2 shows that in assembly, the positioning portion 23 is positioned in the recess slot 131. Each rotating arm 50 is moved to be adjacent to a side of the body 11, and the pivoting post 15 is rotatably engaged in the pivoting hole 51. The positioning pole 61 is inserted through the positioning hole 53 and the sliding slot 211. The positioning nut 63 is engaged with the locking portion 615. Thus, the support bracket 20 is mounted on the base 10.

Each clip 30 is positioned on the support plate 21, and align the locking hole 311 with the installation hole 214. The locking bar 71 is inserted through the locking hole 311 and the installation hole 214. The nut 73 is engaged with the locking bar 71. Thus, each clip 30 is attached to the support plate 21. The two clipping portions 31 are slidable along the positioning pole 71. A distance between the two clipping portions 31 can be adjusted by adjusting a securing location of the nut 73.

When the expansion card 40 is tested, the nut 73 is screwed away from the support plate 21. One clipping portion 31 of each clip 30 is pulled to allow the expansion card 40 to be positioned between the two clipping portions 31 of each clip 30. The nut 73 is screwed towards the support plate 21, to clip the expansion card 40 between the two clipping portions 31. An angle is defined between each rotating arm 50 and the base 10, and the angle is smaller than 90 degrees. The positioning pole 61 is substantially parallel to the body 11.

Figure 3:
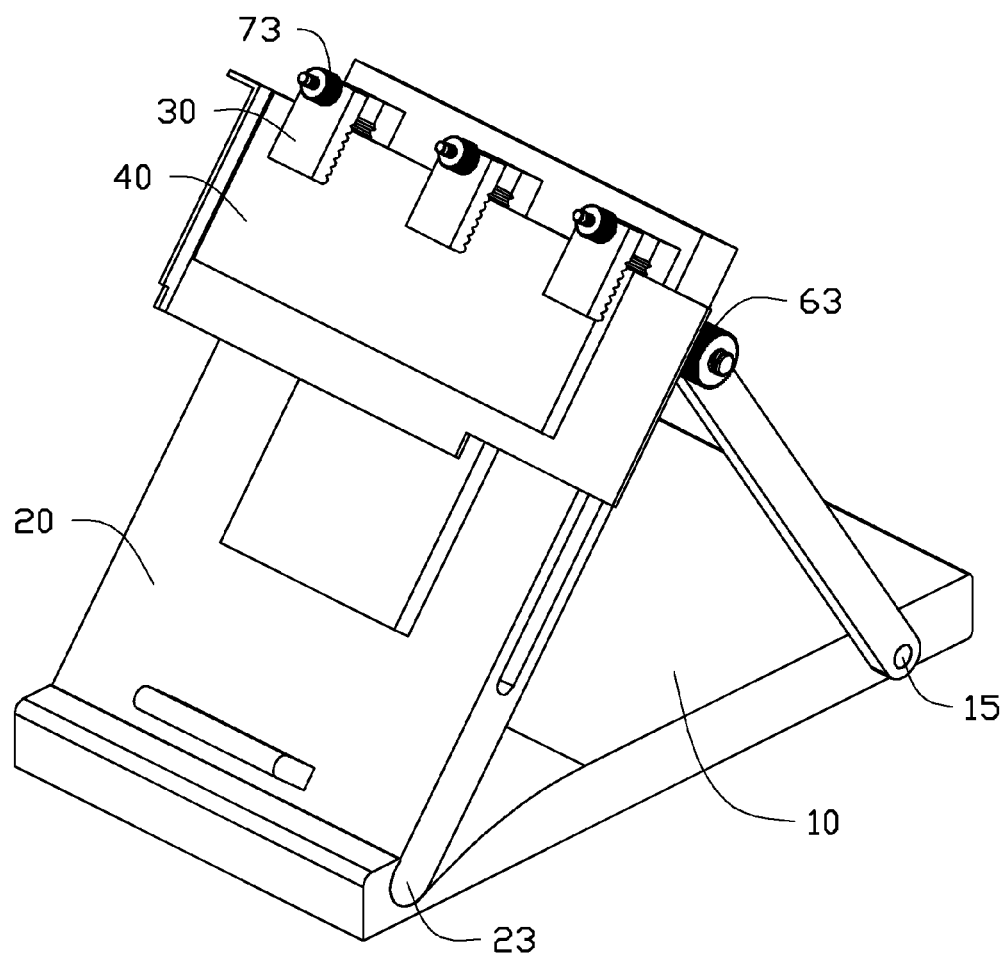
FIG. 3 is similar to FIG. 2, but shows the clipping apparatus and the expansion card in a different state.
Figure 4:
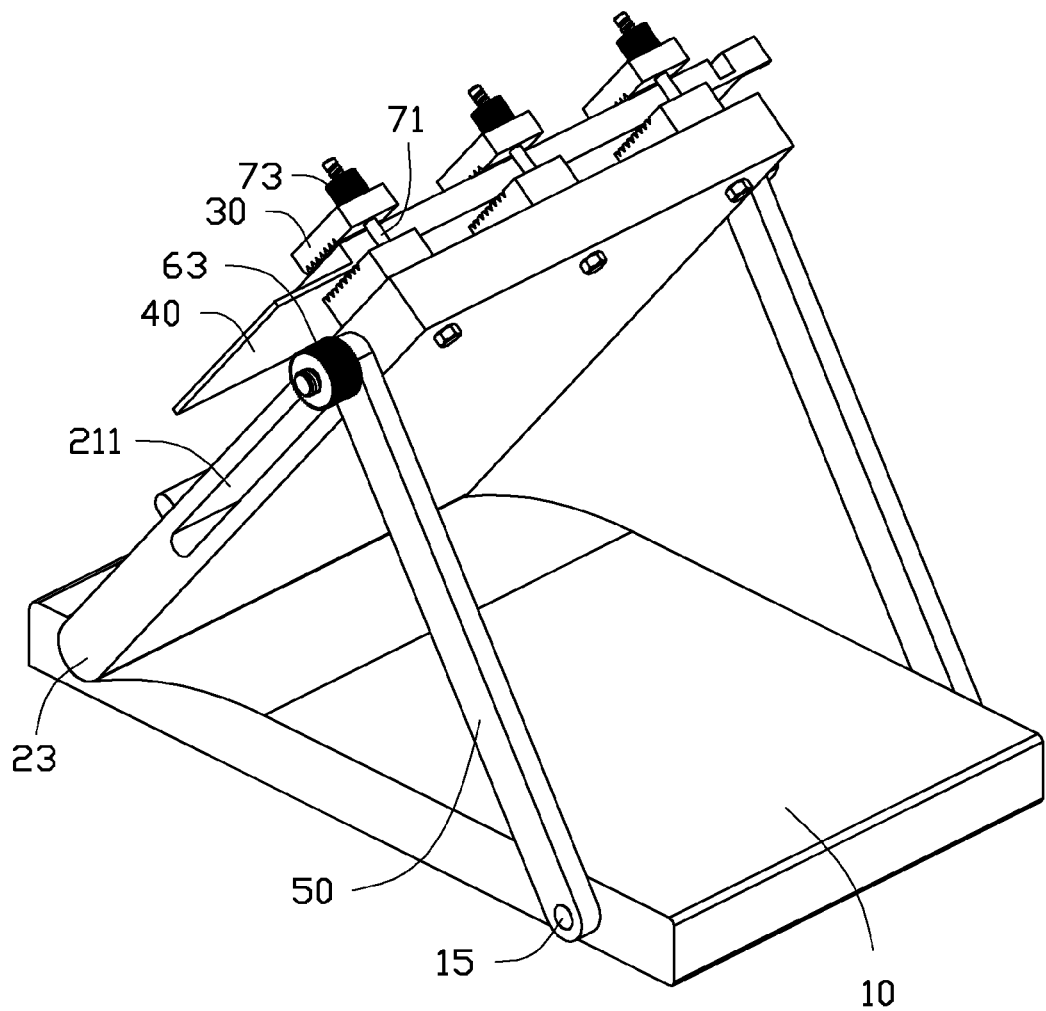
FIG. 4 is similar to FIG. 3, but viewed from a different aspect.

FIG. 3 and FIG. 4 show that, in use, the positioning nut 63 is released, so that the positioning pole 61 is slidable in the sliding slot 211. The positioning pole 61 is slid to rotate the rotating arm 50 relative to the base 10, and the support bracket 20 is pushed to rotate about the recess slot 131 relative to the base 10. When the expansion card 40 is positioned in a suitable position, the positioning nut 63 is screwed to the locking portion 615 to prevent the positioning pole 61 from sliding relative to the support bracket 20. Thus, an angle between the expansion card 40 and the base 10 can be adjusted.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and the arrangement of parts within the principles of the disclosure, to the full extent indicated by the broad general meaning of the terms in which the appended claims are expressed.

What is claimed is:

1. A clipping apparatus for an expansion card, the clipping apparatus comprising:

a base comprising a body and a pivoting post protruding from the body;

a support bracket, the support bracket being located on the base, and the support bracket being oblique relative to the base; and the support bracket defining a sliding slot;

a positioning member slidably engaged in the sliding slot; and a rotating arm;

wherein a first end of the rotating arm defines a pivoting hole, and the pivoting post is pivotably engaged in the pivoting hole; a second end of the rotating arm, opposite to the first end, is secured to the positioning member; an angle is defined between the base and the support bracket and is adjustable when the positioning member is slid relative to the base; the support bracket comprises a support plate and a positioning portion extending from the support plate; the base further comprises a receiving portion extending from a side of the body; the receiving portion defines a recess slot, and the positioning portion is received in the recess slot.

2. The clipping apparatus of claim 1, wherein the positioning member comprises a positioning pole and a positioning nut; the second end of the rotating arm defines a positioning hole; the positioning pole extends through the sliding slot and the positioning hole and is engaged with the positioning nut.

3. The clipping apparatus of claim 2, wherein the positioning pole comprises a head portion, a main body, and a locking portion, the main body is connected between the head portion and the locking portion; the main body is located in the sliding slot; and the positioning nut is engaged with the locking portion.

4. The clipping apparatus of claim 1, wherein the receiving portion comprises a connecting plane between the recess slot and the body, and the connecting plane has an arc shape.

5. The clipping apparatus of claim 1, wherein the positioning portion is half-cylindrical.

6. The clipping apparatus of claim 1, further comprising a clip, wherein the clip comprises two clipping portions attached to the support bracket, and the two clipping portions are for clipping the expansion card therebetween.

7. The clipping apparatus of claim 6, further comprising a locking member, wherein the locking member comprises a locking bar and a nut, and the nut is rotatable engaged with the locking bar and secures the clip to the support bracket.

8. The clipping apparatus of claim 7, wherein the two clipping portions are slidable along the locking bar, to adjust a distance between the two clipping portions.

9. A clipping apparatus for an expansion card, the clipping apparatus comprising:

a base comprising a body, a receiving portion extending from a side of the body and defining a recess slot, and a pivoting post protruding from the body;

a support bracket comprising a support plate and a positioning portion extending from the support plate and rotatably received in the recess slot, and the support bracket being oblique relative to the base; and the support bracket defines a sliding slot;

a positioning member slidably engaged in the sliding slot; and a rotating arm;

wherein a first end of the rotating arm defines a pivoting hole, and the pivoting post is pivotably engaged in the pivoting hole; a second end of the rotating arm, opposite to the first end, is secured to the positioning member; and the support bracket is rotatable relative to the base when the positioning member is slid relative to the base; the receiving portion comprises a connecting plane between the recess slot and the body, and the connecting plane has an arc shape; and the support bracket is rotatable relative to the base along the connecting plane.

10. The clipping apparatus of claim 9, wherein the positioning member comprises a positioning pole and a positioning nut; the second end of the rotating arm defines a positioning hole; the positioning pole extends through the sliding slot and the positioning hole and is engaged with the positioning nut.

11. The clipping apparatus of claim 10, wherein the positioning pole comprises a head portion, a main body, and a locking portion, and the main body is connected between the head portion and the locking portion; the main body is located in the sliding slot; and the positioning nut is engaged with the locking portion.

12. The clipping apparatus of claim 9, wherein the positioning portion is half-cylindrical.

13. The clipping apparatus of claim 9, further comprising a clip, wherein the clip comprises two clipping portions attached to the support bracket, and the two clipping portions are for clipping the expansion card therebetween.

14. The clipping apparatus of claim 13, further comprising a locking member, wherein the locking member comprises a locking bar and a nut, and the nut is rotatable engaged with the locking bar and secures the clip to the support bracket.

15. The clipping apparatus of claim 14, wherein the two clipping portions are slidable along the locking bar, to adjust a distance between the two clipping portions.

* * * * *